US011749631B2

United States Patent
Chen et al.

(10) Patent No.: US 11,749,631 B2
(45) Date of Patent: Sep. 5, 2023

(54) ELECTRONIC PACKAGE INCLUDING A HYBRID THERMAL INTERFACE MATERIAL AND LOW TEMPERATURE SOLDER PATTERNS TO IMPROVE PACKAGE WARPAGE AND RELIABILITY

(71) Applicant: Apple Inc., Cupertino, CA (US)

(72) Inventors: Wei Chen, San Jose, CA (US); Jun Zhai, Cupertino, CA (US); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 10 days.

(21) Appl. No.: 16/879,596

(22) Filed: May 20, 2020

(65) Prior Publication Data
US 2021/0366861 A1    Nov. 25, 2021

(51) Int. Cl.
*H01L 23/00*    (2006.01)
(52) U.S. Cl.
CPC .... *H01L 24/16* (2013.01); *H01L 2224/16238* (2013.01); *H01L 2224/17519* (2013.01)
(58) Field of Classification Search
CPC ......... H01L 23/16; H01L 23/33; H01L 23/36; H01L 23/42; H01L 23/562; H01L 23/3675; H01L 2224/17519; H01L 2224/16238; H01L 23/3735; H01L 21/52; H01L 23/10; H01L 23/053; H01L 23/3737; H01L 24/16; H01L 24/32; H01L 2224/29011; H01L 2224/32245; H01L 24/17; H01L 24/33; H01L 24/81
USPC ........................................................ 257/737
See application file for complete search history.

(56) References Cited

U.S. PATENT DOCUMENTS

| | | | | |
|---|---|---|---|---|
| 6,437,436 B2 * | 8/2002 | Wang | ................ | H01L 23/49816 257/693 |
| 6,486,562 B1 * | 11/2002 | Kato | ................... | H01L 23/4334 257/796 |
| 7,168,484 B2 * | 1/2007 | Zhang | ....................... | F28F 3/02 257/E23.09 |
| 7,440,281 B2 * | 10/2008 | Bailey | ..................... | H01L 23/26 257/E23.087 |
| 7,704,798 B2 * | 4/2010 | Hua | ...................... | H01L 23/367 438/122 |
| 7,728,440 B2 | 6/2010 | Honda | | |
| 8,063,482 B2 * | 11/2011 | Lu | ....................... | H01L 21/6836 257/713 |
| 10,643,924 B1 * | 5/2020 | Shen | ................... | H01L 23/3675 |
| 10,685,920 B2 * | 6/2020 | Yew | ...................... | H01L 23/562 |

(Continued)

FOREIGN PATENT DOCUMENTS

JP    2010-103338 A    5/2010

OTHER PUBLICATIONS

PCT/US2021/032047, "PCT Notification of Transmittal of the International Search Report and the Written Opinion of the International Searching Authority, or the Declaration" dated Sep. 2, 2021, 10 pages.

*Primary Examiner* — Khiem D Nguyen
(74) *Attorney, Agent, or Firm* — Aikin & Gallant, LLP

(57) ABSTRACT

Electronic packages and modules are described. In an embodiment, a hybrid thermal interface material including materials with different thermal conductivities is used to attach a lid to a device. In an embodiment, a low temperature solder material is included as part of an adhesion layer for attachment with a stiffener structure.

16 Claims, 3 Drawing Sheets

(56) References Cited

U.S. PATENT DOCUMENTS

| | | | |
|---|---|---|---|
| 2003/0230800 A1* | 12/2003 | Akai | H01L 23/3128 |
| | | | 257/711 |
| 2004/0238827 A1* | 12/2004 | Takayama | H01L 27/1266 |
| | | | 257/79 |
| 2005/0127502 A1* | 6/2005 | Lee | H01L 23/3735 |
| | | | 257/720 |
| 2010/0096747 A1* | 4/2010 | Kusano | H01L 23/49816 |
| | | | 257/706 |
| 2012/0007229 A1* | 1/2012 | Bartley | H01L 23/3677 |
| | | | 438/122 |
| 2014/0061893 A1* | 3/2014 | Saeidi | H01L 21/52 |
| | | | 257/712 |
| 2015/0155221 A1* | 6/2015 | Chen | H01L 24/17 |
| | | | 257/690 |
| 2015/0187679 A1 | 7/2015 | Ho et al. | |
| 2015/0206851 A1* | 7/2015 | De Sousa | H01L 22/20 |
| | | | 438/118 |
| 2018/0068916 A1* | 3/2018 | Iruvanti | H01L 21/50 |
| 2020/0194335 A1* | 6/2020 | Eid | H01L 24/83 |
| 2021/0118756 A1* | 4/2021 | Wan | H01L 25/18 |

* cited by examiner

ELECTRONIC PACKAGE INCLUDING A HYBRID THERMAL INTERFACE MATERIAL AND LOW TEMPERATURE SOLDER PATTERNS TO IMPROVE PACKAGE WARPAGE AND RELIABILITY

BACKGROUND

Field

Embodiments described herein relate to electronic packaging, and in particular to interface materials between stacked components.

Background Information

As microelectronic packages become thinner and larger in size, structures are also being implemented within the microelectronic packages to control warpage at room and high temperatures. For example, lids are widely used in multiple chip modules (MCMs) for warpage, reliability and thermal performance. In an exemplary implementation one or more devices are surface mounted onto a package substrate, and then optionally underfilled. A lid is then secured onto the package substrate and over the device(s). A stiffener ring can also be mounted onto the package substrate separately from or in combination with the lid.

SUMMARY

Embodiments describe electronic packages and modules including structures and materials to control package warpage. In an embodiment, an electronic package includes a package substrate, a device mounted on the package substrate and lid mounted on the package substrate and spanning over the device. A hybrid thermal interface material (TIM) pattern may connect a top side of the device to an underside of the lid. In an embodiment, the hybrid TIM pattern includes a first TIM pattern of a first TIM and a second TIM pattern of a second TIM, with the first TIM characterized by a higher thermal conductivity than the second TIM.

In an embodiment, an electronic package includes a package substrate, a device mounted on the package substrate, and a stiffener structure attached to the package substrate. In an embodiment, a first adhesion layer material, such as a low temperature solder, characterized by a Young's modulus that is at least two orders of magnitude lower at 250° C. than at 25° C. is used to attach the stiffener structure to the package substrate or a lid. In an embodiment, a hybrid adhesion layer can be used to attach the stiffener structure. For example, a hybrid adhesion layer can include the first adhesion layer material and an adhesive layer material that is non-reflowable at 250° C.

DETAILED DESCRIPTION

Figure 1:
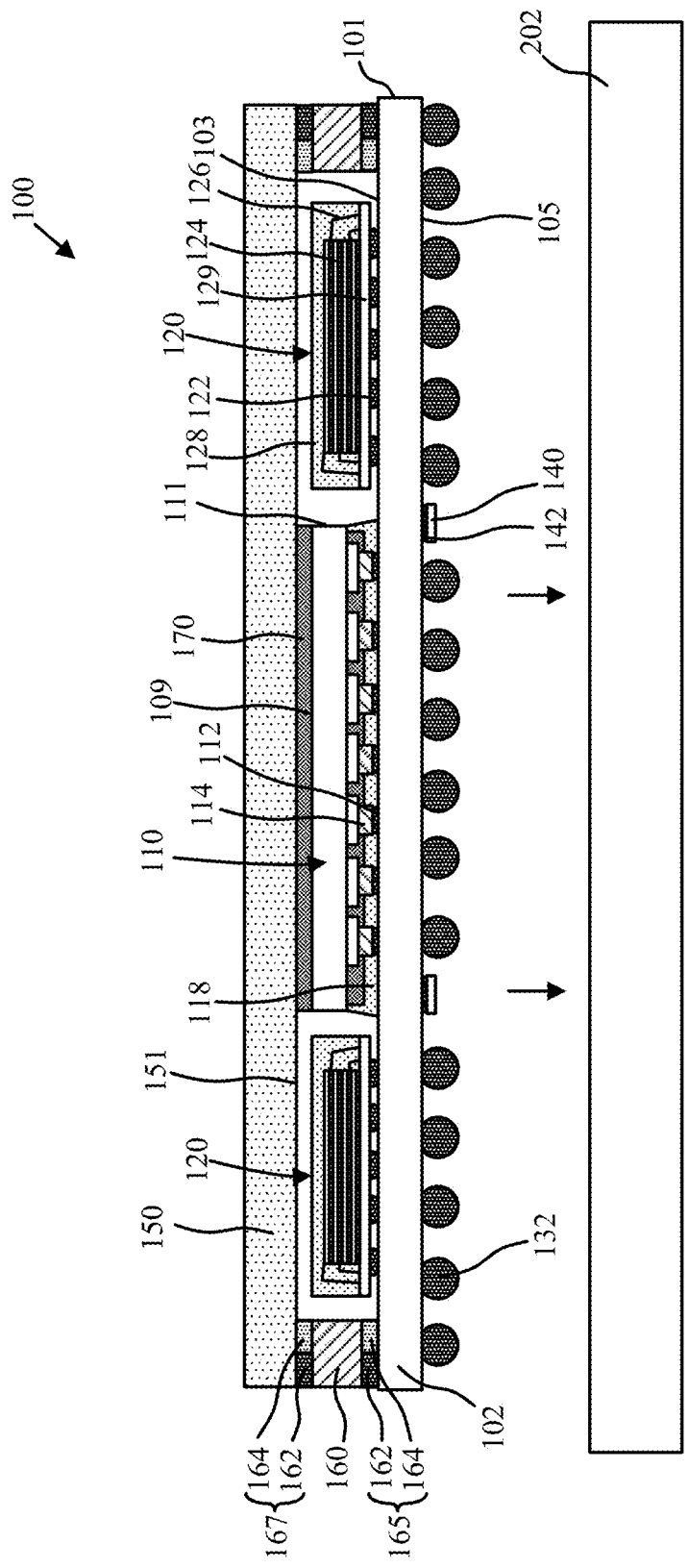
FIG. 1 is a cross-sectional side view illustration of a module and electronic package taken along line Y-Y of FIG. 2 in accordance with an embodiment.

Embodiments describe electronic package structures and modules in which interface materials and patterns between combinations of lids, stiffener structures, and package substrates are used to control package warpage and thermal performance.

In one aspect, hybrid thermal interface material (TIM) patterns including a combination of two or more different TIMs can be adopted to achieve a specified thermal performance while still controlling warpage and mitigating delamination between components. For example, it has been observed that using a single TIM between a device and lid may not offer optimum adhesion, thermal conductivity, and degradation. In accordance with embodiments, a hybrid TIM pattern can connect a top side of a device to an underside of a lid, where the hybrid TIM pattern includes a first TIM pattern of a first TIM and a second TIM pattern of a second TIM with different thermal conductivities, Young's modulus, and adhesion to components (e.g. the lid, and device). In an embodiment, a second TIM pattern with higher modulus (and adhesion) and lower thermal conductivity is located around a first TIM pattern with lower modulus (and adhesion) but higher thermal conductivity. Thus, the first TIM pattern with higher thermal conductively can be located directly above high performance/power regions of the device, while the second TIM pattern can be located over other regions of the device that do not generate as much heat, such as in/out (I/O) regions, which may be located near edges of the device.

In another aspect, a stiffener structure is attached to a package substrate and/or lid with an adhesion layer, which can also be a hybrid adhesion layer with a combination of materials layers. For example, it has been observed that while a stiffener with proper Young's modulus and coefficient of thermal expansion (CTE) can be used for warpage control, the use of a strong coupling adhesive material (e.g. glass paste, cured polymer, etc.) can cause over-correction over a temperature range. In accordance with embodiments, a first adhesion layer material is utilized that can provide strong coupling between a stiffener structure and the package substrate and/or lid at room temperature, while not over-correcting warpage at higher temperatures, such as high temperature solder reflow temperatures (e.g. 250° C. and above) that may be used for bonding the package to a circuit board, or bonding of other components to the circuit board. Such a first adhesion layer material may thus have different properties at room temperature (e.g. 25° C.) and high temperature. In an embodiment, a first adhesion layer material is characterized by a Young's modulus that is at least two orders of magnitude lower at high temperature (e.g. 200° C., or 250° C. and above) than at room temperature (e.g. 25° C.). In an embodiment, a first adhesion layer material is reflowable at high temperature and non-reflowable (solid) at room temperature. Exemplary materials include low temperature solder materials, which may liquefy at high temperature and have an almost zero Young's modulus. For example, a low temperature solder material layer may be characterized by a melting temperature below 160° C. In such an embodiment, a liquified low temperature solder material may be held in place with surface tension at the high temperature solder reflow temperatures (e.g. 200° C., or 250° C. and above).

In some embodiments, an adhesion layer between the stiffener structure and package substrate or lid is a hybrid layer including regions of both a first adhesion layer material with substantially different properties (e.g. low temperature solder) at low temperature and high temperature (e.g. difference in Young's modulus of at least two orders of magnitude, non-reflowable v. reflowable, etc.) and an adhesive material layer with substantially similar properties at low temperature and high temperature. Such an adhesive material layer may be formed of a more customary material such as glass paste or cured polymer including thermoplastics and cross-linked thermosets such as polyimide, silicone epoxy, etc. that cannot be reflowed. Thus, a hybrid adhesion layer may include a first adhesion layer formed of a reflowable material (e.g. solder material) and a non-reflowable adhesive material layer.

The hybrid thermal interface material (TIM) patterns and stiffener structure adhesion layers can both be implemented in the same electronic package in accordance with embodiments.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2:
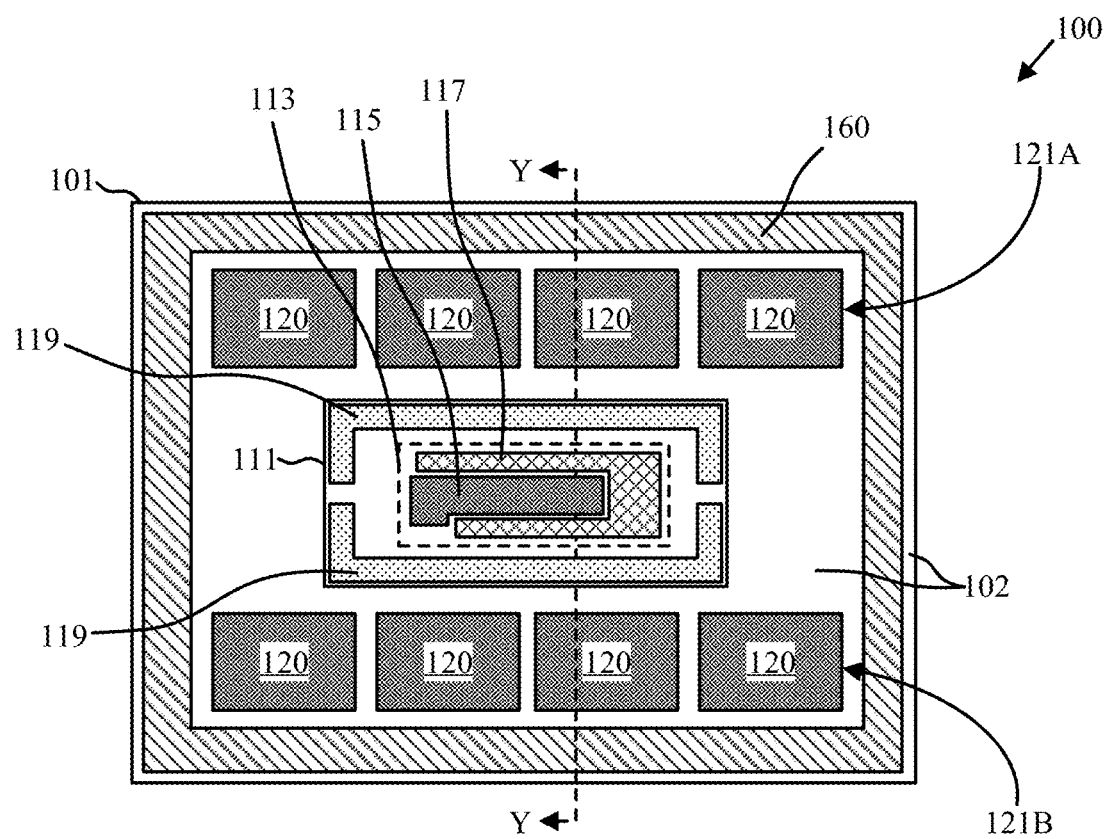
FIG. 2 is a schematic top view illustration of an electronic package in accordance with an embodiment.

Referring now to FIGS. 1-2, FIG. 1 is cross-sectional side view illustration of an electronic package 100 taken along line Y-Y of FIG. 2 in accordance with an embodiment. FIG. 2 is a schematic top view illustration of a mounted electronic package 100 structure in accordance with an embodiment. As illustrated, a memory module may include a circuit board 202 and an electronic package 100 mounted on the circuit board 202. This may be accomplished using flip chip bonding and solder bumps 132. In an embodiment solder bumps 132 are formed of high temperature solder material, characterized by a reflow temperature of 200° C. or more, such as 250° C.

In accordance with embodiments, various structures are described which may mitigate electronic package warpage. This can facilitate testing at room temperature, for example using a pogo pin test where solder bumps 132 or underlying landing pads are connected to pogo pin array. This may also facilitate mounting (e.g. onto circuit board 202) at high temperatures, thus reducing the risk of solder ball bridging or non-wetting, particularly when bump pitch is small.

The electronic package 100 in accordance with embodiments may include a package substrate 102 and a first device 110 mounted on a top side 103 of the package substrate 102. For example, the first device may be a logic die, such as a system-on-chip (SOC) die. While a single device 110 is illustrated, there may be multiple devices 110. For example, multiple devices 110 may occupy the same perimeter illustrated by the first device 110 in FIG. 2. In an embodiment, a device 110 includes various functional regions (areas), such as a logic region 113 including a high performance logic region 115, optional low performance logic region 117, and other regions such as in/out (I/O) region 119. The I/O region 119 may optionally be nearest the edges 111 of the device 110.

A first plurality of additional components 120, such as memory packages, can also be mounted on the top side 103 of the package substrate 102. As shown in FIG. 2, the first plurality of components 120 may optionally include a first and second groups 121A, 121B mounted on opposite sides of the one or more devices 110. Routing is provided within the package substrate 102 to connect the device(s) 110 with plurality of components 120. Additional components can optionally be mounted on a bottom side 105 of the package substrate 102 in an alternative configuration. One or more discrete integrated passive devices (IPDs) 140 can be mounted at a location such as a bottom side 105 of the package substrate 102 laterally between the solder bumps 132. Discrete IPDs 140 can also be located within the package substrate 102.

The exemplary components 120 illustrated include a plurality of memory dies 124 stacked on a substrate 129, connected with wire bonds 126, and encapsulated in a molding material 128. It is to be appreciated this is an exemplary implementation, and embodiments are not limited to this specific component configuration. In accordance with embodiments the components 120 may be DRAM packages including one or more DRAM dies. Furthermore, the electronic packages 100 may be implemented with a variety of memory technologies including LPDDR, LPDDR-x, HBM, HMC, etc.

The electronic packages in accordance with embodiments can include the one or more device(s) 110 mounted on the top side 103 of the package substrate 102 using solder bumps 112. As shown, solder bumps 112 may be applied to contacts 114. The mounted device(s) 110 can be secured with an underfill material 118. The first and second pluralities of components 120 may also be mounted on the top (and optionally bottom) side of the package substrate using solder bumps 122, and the routing substrate can be mounted to the bottom side 105 of the package substrate 102 with solder bumps 132. Solder bumps 112, 122 in accordance with embodiments may be micro bumps and have smaller volume/area than solder bumps 132 for mounting to circuit board 202. Furthermore, the discrete IPDs 140 may also be mounted using solder bumps 142, which may be micro bumps of smaller volume/area than solder bumps 112, 122, 132.

In an embodiment such as that illustrated in FIG. 2 the one or more device(s) 110 are mounted in a center of the electronic package 100, or package substrate 102. For example, the lateral edges 111 of the device 110 may be equidistant from a corresponding edge 101 of the electronic package 100 (which may correspond to an edge of the package substrate 102) along one or more x-axis or y-axis (illustrated by line Y-Y). The device 110 may additionally be symmetrical about the x-axis and/or y-axis. In another embodiment, the one or more device(s) 110 is not mounted in a center of the electronic package 100, or package substrate 102.

The electronic packages 100 in accordance with embodiments may include various support structures for mechanical balancing due to the thin package substrate 102. For example, the package substrate 102 may lack some mechanical robustness that would otherwise be provided by a thick core. Mechanical balancing may be achieved using either, or a combination of, a stiffener structure 160 and/or lid 150. In the embodiments illustrated in FIGS. 1-2 a stiffener structure 160 is mounted to the top side 103 of the package substrate 102. The stiffener structure 160 may be ring-shaped and may include additional shapes including ribs. The stiffener structure 160 may laterally surround the plurality of components 120 and the device(s) 110.

Figure 3:
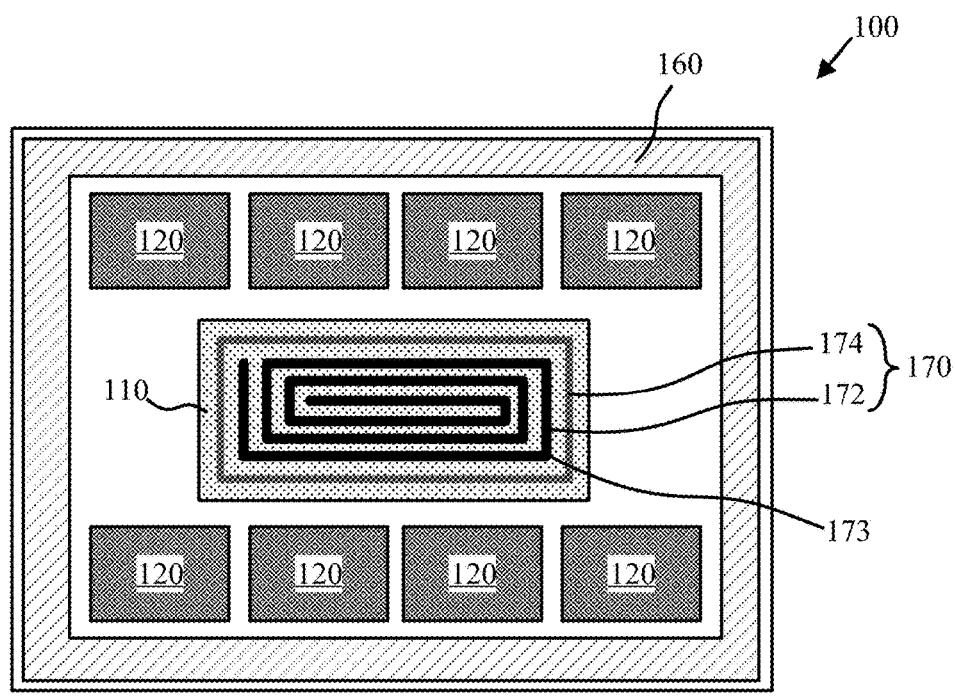
FIG. 3 is a schematic top view illustration of an electronic package with a hybrid thermal interface material pattern in accordance with an embodiment.

In an embodiment, the electronic package 100 includes a lid 150 mounted on the package substrate 102 and spanning over the device 110. A hybrid thermal interface material pattern 170 may connect a top side 109 of the device 110 to an underside 151 of the lid 150. Referring to FIG. 3, a schematic top view illustration is provided of an electronic package 100 with a hybrid TIM pattern 170 in accordance with an embodiment, and without the overlying lid 150. In accordance with embodiments, the hybrid TIM pattern 170 can include a first TIM pattern 172 of a first TIM and a second TIM pattern 174 of a second TIM. The first and second TIMs can be characterized by different thermal conductivities, Young's modulus, and adhesion to the device 110 and lid 150. In an embodiment, the second TIM may be a high adhesion, high Young's modulus material located at a periphery of the device 110 to prevent delamination of the lid 150, improve package warpage, and reduce degradation. In an embodiment, the first TIM may be high thermal conductivity material for thermal performance. For example, the first TIM maybe soft adhesive type material such as silicone resin with a metal particle filler (e.g. silver, Ag) that can achieve thermal conductivity of 10 W/mK or above. The Young's modulus can be in the range of several MPa to more than 10 MPa. The first TIM may leverage chemical bonding for adhesion. The first TIM can also be a gel type material with very low modulus of 10-100 kPa. In an embodiment, the first TIM does not include an adhesion promoter and leverages physical bonding only. As a consequence, the adhesion maybe low, though the bulk elongation is high. The second TIM can be an adhesive type of material (e.g. glass paste, cured polymer such as polyimide, silicone epoxy, etc.) and may also include an adhesion promoter to provide high adhesion and prevent delamination. The Young's modulus can be in the magnitude of 100 MPa, and thermal conductivity can be 3-5 W/mK. A variety of hybrid patterns with two or more materials can be adopted.

Still referring to FIG. 3, in an embodiment, the first TIM (corresponding to the first TIM pattern 172) is characterized by a higher thermal conductivity than the second TIM (corresponding to the second TIM pattern 174). Similarly, the second TIM can be characterized by a higher Young's modulus than the first TIM. The second TIM pattern 174 may be located around a perimeter 173 of the first TIM pattern 172, and may be located nearer the lateral edges 111 of the device 110 than the first TIM pattern 172. Referring to both FIGS. 2 and 3, the device 110 can include a high performance logic region 115 and an I/O region 119. In an embodiment, the first TIM pattern 172 is located directly over a larger area of the high performance logic region 115 than the second TIM pattern 174 is. Such an arrangement may be utilized to more effectively draw heat away from the high performance region when the first TIM is formed of a higher thermal conductivity material. In an embodiment, the second TIM pattern 174 is located directly over a larger area of the I/O region 119 than the first TIM pattern 172 is. Such an arrangement may be utilized to prevent delamination of the lid, improve package warpage, and reduce degradation, particularly when the second TIM is formed of a material with higher adhesion to the lid 150, and has a characteristic higher Young's modulus.

A stiffener structure 160 can be attached to the package substrate 102 with a lower adhesion layer 165. In an embodiment, the lower adhesion layer 165 includes a first adhesion layer 162. For example, the first adhesion layer may be formed of a material characterized by different properties at room temperature and high temperature. In an embodiment, a first adhesion layer 162 material is characterized by a Young's modulus that is at least two orders of magnitude lower at high temperature (e.g. 250° C. and above) than at room temperature (e.g. 25° C.). In an embodiment, a first adhesion layer 162 material is reflowable at high temperature. Exemplary materials include low temperature solder materials, which may liquefy at high temperature and have an almost zero Young's modulus. For example, a low temperature solder material layer may be characterized by a melting temperature below 160° C. In such an embodiment, a liquified low temperature solder material may be held in place with surface tension at the high temperature solder reflow temperatures (e.g. 250° C. and above).

In an embodiment, the lower adhesion layer 165 includes an adhesive material layer 164. The adhesive material layer 164 may be non-reflowable at 250° C. For example, the adhesive material may include a cured polymer such as polyimide, silicone epoxy, etc. The adhesive material may be filled with a particle filler such as aluminum particles to aid in heat transfer. The lower adhesion layer 165 can include multiple adhesion materials.

Figure 4:
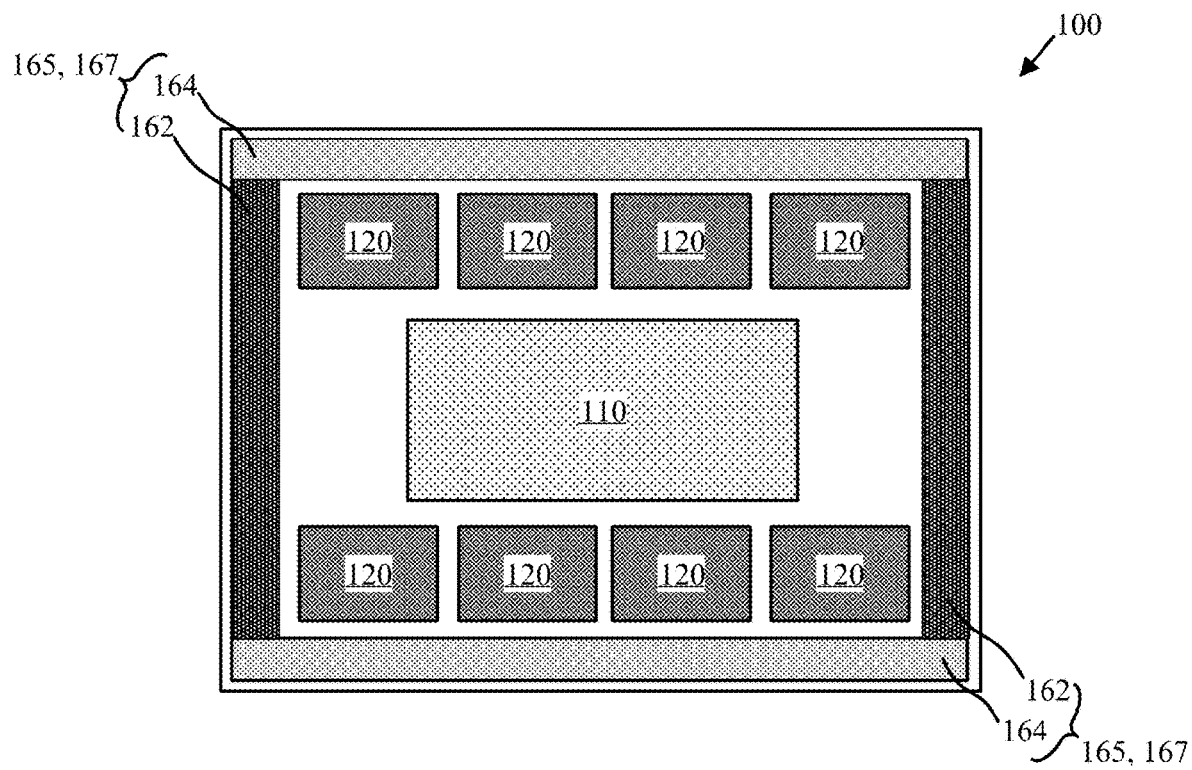
FIG. 4 is a schematic top view illustration of an electronic package with an adhesion layer pattern for a stiffener structure in accordance with an embodiment.

FIG. 4 is a schematic top view illustration of an electronic package 100 with a hybrid adhesion layer pattern for a stiffener structure in accordance with an embodiment. In particular, FIG. 4 illustrates a hybrid lower adhesion layer 165 prior to mounting of the stiffener structure, or a hybrid upper adhesion layer 167 prior to mounting of the lid onto the stiffener structure 160 of FIG. 3. In an embodiment, the lower adhesion layer 165 includes a first adhesion layer 162, which may be a low melting temperature solder material characterized by a melting temperature below 160° C. In an embodiment, a first portion of the stiffener structure is attached to the package substrate with an adhesive material layer 164, and a second portion of the stiffener structure is attached to the package substrate with the first adhesion layer 162. As shown, the first adhesion layer(s) 162 and adhesive material layer(s) 164 may be side-by-side with one another.

Referring briefly to FIG. 1, the lid 150 may span over and be attached to the stiffener structure 160. The lid 150 may be attached to the stiffener structure 160 with an upper adhesion layer 167, which may also be a hybrid adhesion layer such as that described with regard to lower adhesion layer 165. In an embodiment, the upper adhesion layer 167 includes a first adhesion layer 162, which may be a low melting temperature solder material characterized by a melting temperature below 160° C. In an embodiment, a first portion of the lid 150 is attached to the stiffener structure 160 with an adhesive material layer 164, and a second portion of the lid is attached to the stiffener structure 160 with the first adhesion layer 162.

In utilizing the various aspects of the embodiments, it would become apparent to one skilled in the art that combinations or variations of the above embodiments are possible to control package warpage. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic package comprising:
a package substrate including a first side and a second side and routing within the package substrate;
a plurality of solder bumps on the second side of the package substrate, the plurality of solder bumps characterized by a reflow temperature of at least 200° C.;
a device mounted on the first side of the package substrate and connected with the routing;
a lid mounted on the first side of the package substrate and spanning over the device;
a hybrid thermal interface material (TIM) pattern connecting a top side of the device to an underside of the lid, wherein the hybrid TIM pattern includes a first TIM pattern of a first TIM and a second TIM pattern of a second TIM, the first TIM characterized by a higher thermal conductivity than the second TIM; and
a stiffener structure attached to the first side of the package substrate with a first solder material layer characterized by a melting temperature below 160° C. and a Young's modulus that is at least two orders of magnitude lower at the reflow temperature of the plurality of solder bumps than at 25° C.;
wherein a first portion of the stiffener structure is attached to the package substrate with a first adhesive material layer that is non-reflowable at 250° C. and a second portion of the stiffener structure is attached to the package substrate with the first solder material layer.

2. The electronic package of claim 1, wherein the second TIM is characterized by a higher Young's modulus than the first TIM.

3. The electronic package of claim 2, wherein the second TIM pattern is around a perimeter of the first TIM pattern.

4. The electronic package of claim 2, wherein the second TIM pattern is located nearer lateral edges of the device than the first TIM pattern.

5. The electronic package of claim 2, wherein the device includes a high performance logic region and an in/out (I/O) region, and the first TIM pattern is located directly over a larger area of the high performance logic region than the second TIM pattern is.

6. The electronic package of claim 5, wherein the second TIM pattern is located directly over a larger area of the I/O region than the first TIM pattern is.

7. The electronic package of claim 1, wherein the lid spans over and is attached to the stiffener structure, and the lid is attached to the stiffener structure with a second solder material layer characterized by a melting temperature below 160° C. and a Young's modulus that is at least two orders of magnitude lower at 250° C. than at 25° C.

8. The electronic package of claim 7, wherein a first portion of the lid is attached to the stiffener structure with a second adhesive material layer that is non-reflowable at 250° C. and a second portion of the lid is attached to the stiffener structure with the second solder material layer.

9. An electronic package comprising:
a package substrate including a first side and a second side and routing within the package substrate;
a plurality of solder bumps on the second side of the package substrate, the plurality of solder bumps characterized by a reflow temperature of at least 200° C.;
a device mounted on the first side of the package substrate and connected with the routing; and
a stiffener structure attached to the first side of the package substrate with a first solder material layer characterized by a melting temperature below 160° C. and a Young's modulus that is at least two orders of magnitude lower at the reflow temperature of the plurality of solder bumps than at 25° C.;
wherein a first portion of the stiffener structure is attached to the package substrate with a first adhesive material layer that is non-reflowable at 250° C. and a second portion of the stiffener structure is attached to the package substrate with the first solder material layer.

10. The electronic package of claim 9, further comprising a lid that spans over and is attached to the stiffener structure with a first adhesion layer material characterized by a Young's modulus that is at least two orders of magnitude lower at 250° C. than at 25° C.

11. The electronic package of claim 10, wherein the first adhesion layer material is reflowable at 250° C. and non-reflowable at 25° C.

12. The electronic package of claim 11, wherein the first adhesion layer material is a second solder material layer characterized by a melting temperature below 160° C.

13. The electronic package of claim 12, wherein a first portion of the lid is attached to the stiffener structure with a second adhesive material layer that is non-reflowable at 250° C. and a second portion of the lid is attached to the stiffener structure with the second solder material layer.

14. An electronic package comprising:
a package substrate including a first side and a second side and routing within the package substrate;
a plurality of solder bumps on the second side of the package substrate, the plurality of solder bumps characterized by a reflow temperature of at least 200° C.;
a device mounted on the first side of the package substrate and connected with the routing;
a stiffener structure attached to the first side of the package substrate; and
a lid that spans over and is attached to the stiffener structure;
wherein a first portion of the lid is attached to the stiffener structure with an adhesive material layer that is non-reflowable at 250° C. and a second portion of the lid is attached to the stiffener structure with a solder material layer characterized by a melting temperature below 160° C. and a Young's modulus that is at least two orders of magnitude lower at the reflow temperature of the plurality of solder bumps than at 25° C.

15. A module comprising:
a circuit board; and
a package mounted on the circuit board with a plurality of solder bumps characterized by a reflow temperature of at least 200° C., the package comprising:
a package substrate including a first side and a second side and routing within the package substrate, the second side bonded to the circuit board with the plurality of solder bumps;
a device mounted on the first side of the package substrate and connected with the routing;
a lid mounted on the package substrate and spanning over the device;

a hybrid thermal interface material (TIM) pattern connecting a top side of the device to an underside of the lid, wherein the hybrid TIM pattern includes a first TIM pattern of a first TIM and a second TIM pattern of a second TIM, the first TIM characterized by a higher thermal conductivity than the second TIM; and a stiffener structure attached to the first side of the package substrate with a first solder material layer characterized by a melting temperature below 160° C. and a Young's modulus that is at least two orders of magnitude lower at the reflow temperature of the plurality of solder bumps than at 25° C.;

wherein a first portion of the stiffener structure is attached to the package substrate with a first adhesive material layer that is non-reflowable at the reflow temperature of the plurality of solder bumps and a second portion of the stiffener structure is attached to the package substrate with the first solder material layer.

16. The module of claim 15, wherein a first portion of the lid is attached to the stiffener structure with a second adhesive material layer that is non-reflowable at the reflow temperature of the plurality of solder bumps and a second portion of the lid is attached to the stiffener structure with a second solder material layer that is characterized by a melting temperature below 160° C. and a Young's modulus that is at least two orders of magnitude lower at the reflow temperature of the plurality of solder bumps than at 25° C.

\* \* \* \* \*